United States Patent [19]
Fischer

[11] Patent Number: 5,929,666
[45] Date of Patent: Jul. 27, 1999

[54] BOOTSTRAP CIRCUIT

[75] Inventor: Jonathan Herman Fischer, Blandon, Pa.

[73] Assignee: Lucent Technologies Inc., Murray Hill, N.J.

[21] Appl. No.: 08/253,884

[22] Filed: Jun. 3, 1994

[51] Int. Cl.⁶ .................................................... H03B 1/00
[52] U.S. Cl. ........................ 327/111; 327/432; 327/536
[58] Field of Search .................................. 307/246, 264, 307/296.2, 296.7, 446, 482, 570, 578; 327/109, 111, 432, 434, 536, 535, 314, 320, 318

[56] References Cited

U.S. PATENT DOCUMENTS

| | | | |
|---|---|---|---|
| 3,569,742 | 3/1971 | Schroeder . | |
| 4,275,437 | 6/1981 | Boll et al. | 363/60 |
| 4,558,234 | 12/1985 | Suzuki et al. | 307/446 |
| 4,794,280 | 12/1988 | Tran | 307/446 |
| 4,882,534 | 11/1989 | Koshizuka | 307/570 |
| 4,965,470 | 10/1990 | Shin | 307/446 |
| 5,111,077 | 5/1992 | Young et al. | 307/570 |
| 5,394,038 | 2/1995 | Sobue et al. | 327/432 |

FOREIGN PATENT DOCUMENTS

| | | | |
|---|---|---|---|
| A-0 092 809 | 11/1983 | European Pat. Off. | H03K 19/094 |
| A-61 120521 | 6/1986 | Japan | H03K 17/04 |
| A-56 087930 | 7/1991 | Japan | H03K 17/04 |

OTHER PUBLICATIONS

"An Adjustable Output Driver with a Self–Recovering Vpp Generator for a 4M×16 DRAM," K. Furutani, et al., IEEE Journal of Solid–State Circuits, vol. 29, No. 3, Mar. 1994, pp. 308–310.

"On–Chip High Voltage Generation in MNOS Integrated Circuit Using an Improved Voltage Multiplier Technique," John F. Dickson, IEEE Journal of Solid–State Circuits, vol. SC–11, No. 3, Jun. 1976, pp. 374–378.

"Nonideal Effects in Switched–Capacitor Circuits",Analog MOS Integrated Circuits for Signal Processing, Chapter 7, pp. 462–529, R. Gregorian, Sierra Semiconductor, San Jose, California, Los Angeles, California, published by John Wiley & Sons, New York 1986.

*Primary Examiner*—Timothy P. Callahan
*Assistant Examiner*—Jung Ho Kim
*Attorney, Agent, or Firm*—David L. Smith

[57] ABSTRACT

Briefly, in accordance with one embodiment of the invention, a bootstrap circuit comprises a pair of drivers coupled together so as to form a bootstrap node and a bipolar transistor coupled to the bootstrap node. A method of using a bipolar transistor in such a bootstrap circuit comprises the step of applying a voltage signal to the input ports of the drivers, the voltage signal having a magnitude sufficient to activate the bipolar transistor.

11 Claims, 4 Drawing Sheets

BOOTSTRAP CIRCUIT

TECHNICAL FIELD

The invention relates to bootstrap circuits and, more particularly, to bootstrap circuits for use with low voltage supplies or sources.

1. Background of the Invention

Switched-capacitor integrators are used in a variety of applications, such as in signal processing. One problem with such switched-capacitor integrator circuits is driving the switches, particularly where the switches are implemented in p-channel MOS technology with power supplies providing less than 5 volts. To reduce the supply voltage necessary to drive such p-channel MOS switches, a bootstrap clock driver is typically employed. Such bootstrap clock drivers are also typically implemented in CMOS technology as well as p-channel or n-channel MOS technology. A problem with such MOS bootstrap clock driver circuits, however, is the number of bootstrap stages to provide a sufficiently high voltage amplitude or magnitude to drive the p-channel gate in such an MOS switched-capacitor integrator circuit. This may be an even greater problem where the voltage supply is in the range of approximately 2 volts to 3.3 volts, such as for lithium battery-powered equipment or devices. Thus, a need exists for a bootstrap circuit having the capability to develop a voltage sufficient to drive, for example, an MOS transistor, even when powered from a low voltage source or supply.

2. Summary of the Invention

Briefly, in accordance with one embodiment of the invention, a bootstrap circuit comprises a pair of drivers coupled together so as to form a bootstrap node and a bipolar transistor coupled to the bootstrap node. A method of using a bipolar transistor in such a bootstrap circuit comprises the step of applying a voltage signal to the input ports of the drivers, the voltage signal having a magnitude sufficient to activate the bipolar transistor.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

As previously described, switched-capacitor integrators are used in a variety of applications, such as in signal processing. Many mixed signal MOS chips use such switched-capacitor circuits for analog signal filtering, as well as for analog-to-digital or digital-to-analog conversion. A basic component of such a switched-capacitor circuit is the CMOS transmission gate. In a basic switched-capacitor integrator, such as described, for example, in G. Moschytz, *MOS Switched-Capacitor Filters*, available from IEEE Press (1984), the voltage signal swing is typically symmetric about the signal reference point. Thus, the signal reference point is usually set approximately half-way between the minimum power supply voltage and electrical ground. Thus, for example, for a low voltage power supply, such as approximately 2.4 volts, the signal reference point is approximately 1.2 volts.

As is well-known, such switched-capacitor integrators are typically implemented with complementary MOS (CMOS) devices. Typically, in such devices, the p-channel switch n-tub is tied or coupled to the power supply, whereas the n-channel switch p-tub is tied or coupled to electrical ground (GND). With a 5 volt power supply, the gate-to-source voltages for the MOS devices in a typical CMOS switch are large enough to maintain a sufficiently low activation resistance so that at least one MOS device may be "turned on" for voltages between ground and 5 volts. A problem with a low voltage power supply, such as around 2.4 volts, is that for such a CMOS switch for a region of voltages near approximately 1.2 volts, for example, both the n-channel and p-channel devices are "off," preventing proper circuit operation. Driving the p-channel gate of such a CMOS switch to below GND lowers the nominal "on" or activation resistance of a typical MOS switch. For example, driving the p-channel gate to −1.9 volts, or 1.9 volts below GND, may lower the nominal on resistance by a factor of 100 and ensure that at least one MOS device in the CMOS switch is "on" for signal levels between GND and the power supply voltage. The p-channel gate may be driven to below GND by a bootstrap circuit in accordance with the invention.

Figure 1:
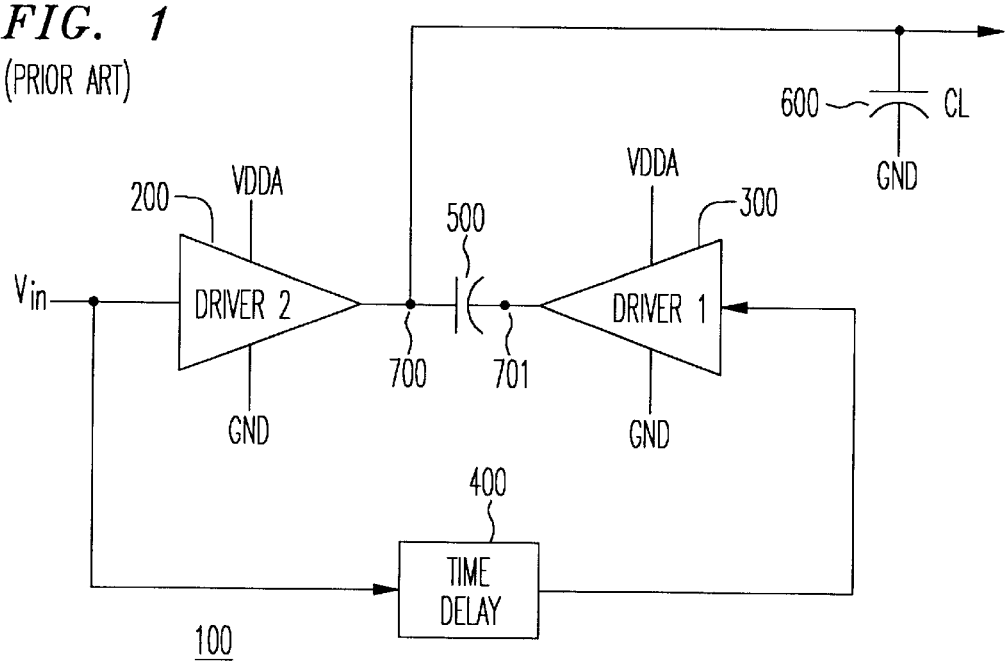
FIG. 1 is a schematic diagram illustrating one embodiment of a basic bootstrap driver circuit.

FIG. 1 illustrates a schematic diagram of a basic bootstrap circuit 100, such as described in, for example, *Analog MOS Integrated Circuits for Signal Processing*, by R. Gregorian and G. Temes, available from John Wiley & Sons (1986). As illustrated, bootstrap circuit 100 includes two voltage drivers, 200 and 300, having output ports coupled together via a capacitor 500. Likewise, on one side of capacitor 500 is a bootstrap node 700. The circuit also includes a time delay 400. In FIG. 1 capacitor 600 (CL) represents the line capacitance coupled to the bootstrap circuit. In this context, a high signal is taken to be VDDA, or 2.4 volts, and a low signal is taken to be GND, although the invention is not limited in scope in this respect. Likewise, in this particular embodiment $V_{in}$, the voltage at node 700, and the voltage at the output port of delay 400 are assumed to be initially high and the voltage drivers and time delay are noninverting. In operation, when $V_{in}$ transitions from a "high" state to a "low" state, the output signal of driver 200 also becomes low. Time delay 400 continues to provide a high voltage signal to the input port of driver 300 so that capacitor 500 may charge to the power supply voltage. After time delay 400 changes state, then driver 300 provides a low output signal and node 700 is driven below GND with capacitor 500 acting as a battery with a positive terminal tied or coupled to GND due to the output port of driver 300.

Figure 2:
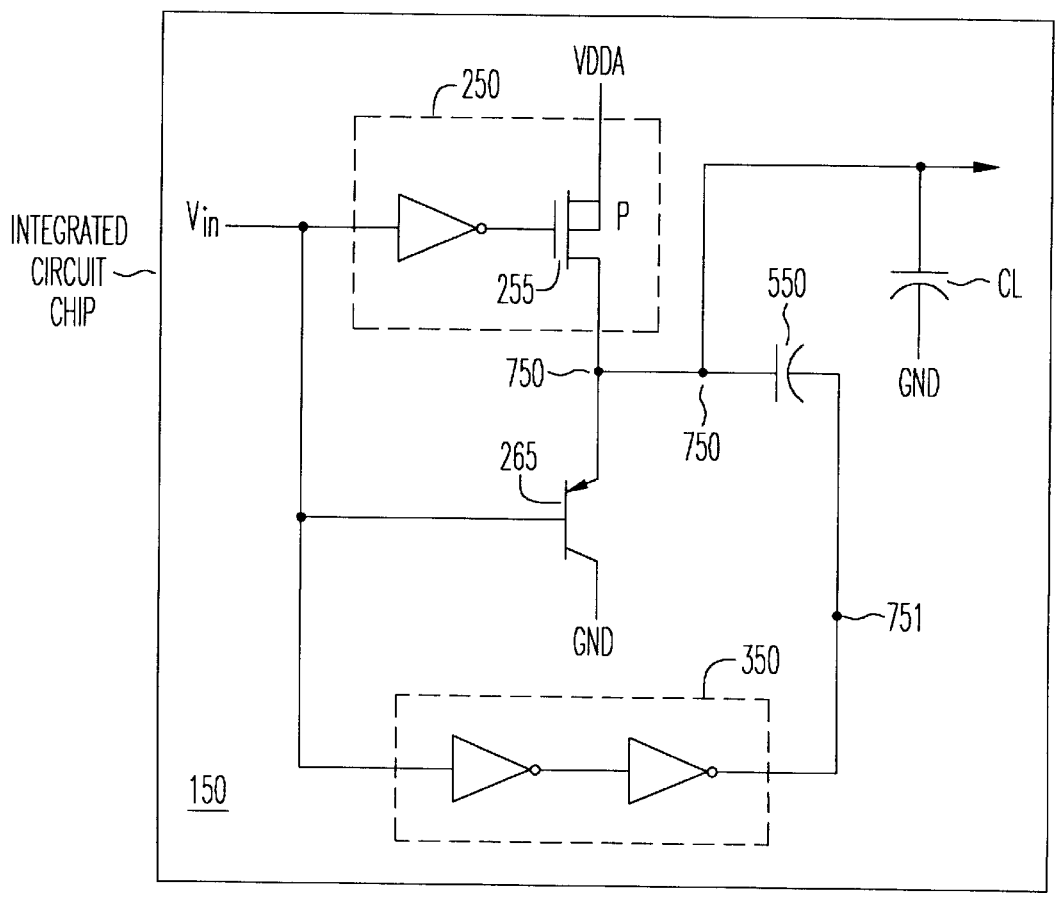
FIG. 2 is a schematic diagram illustrating one embodiment of a bootstrap circuit in accordance with the invention.

As previously discussed and as illustrated in FIG. 1, the goal of a bootstrap circuit is to drive the bootstrap node below GND. FIG. 2 illustrates a schematic diagram of an embodiment of a bootstrap circuit in accordance with the invention. As illustrated in FIG. 2, bootstrap circuit 150 includes a first voltage driver 250, a second voltage driver 350, a transistor 265, a capacitor 550 and a bootstrap node or nodes 750. Likewise, as illustrated in FIG. 2, in comparison with FIG. 1, time delay 400 and driver 300 of FIG. 2 have been combined by using two cascaded inverting voltage drivers in this particular embodiment to provide voltage driver 350. Likewise, as illustrated in FIG. 2, driver 250 includes an output stage having an MOS device 255 coupled to voltage supply VDDA. Likewise, in this particular embodiment, transistor 265 comprises a bipolar transistor and drivers 250 and 350 are coupled together via capacitor 550 so as to form bootstrap node 750. Bipolar transistor 265 is also coupled to bootstrap node 750 and, thus, is coupled to MOS device 255. One advantage of the use of bipolar transistor 265 in bootstrap circuit 150, instead of an MOS device, is that the transistor does not have the "threshold plus body effect" of the MOS device, such as described, for example, in *Operation and Modeling of the MOS Transistor*, by Y. Tsividis, available from McGraw Hill (1987). In this particular embodiment, the base-emitter voltage is approximately 0.6 volts and the charging voltage for capacitor 550 is the supply voltage, VDDA in FIG. 2, minus the base-emitter voltage, providing a voltage improvement in comparison with a conventional bootstrap circuit implemented in MOS technology only. In operation, a voltage signal, $V_{in}$, is applied to the input ports of drivers 250 and 350 and transistor 265 and swings between VDDA and GND to activate MOS transistor 255 and bipolar transistor 265. More particularly, as described with respect to FIG. 1, it is assumed in this particular embodiment that at some point in operation $V_{in}$, node 750, and the output port of driver 350 are all high. A first voltage signal, such as a "low" signal, having a magnitude sufficient to activate or "turn on" transistor 265 and "turn off" MOS device 255 is then applied to the transistor, as well as to the voltage drivers. Due to the time delay of driver 350, capacitor 550 charges to the power supply voltage, VDDA, minus the base-emitter voltage of transistor 265. Eventually, the output port of driver 350 becomes "low" and node 750 is pushed below GND due to the voltage across capacitor 550, which also reverse biases the base-emitter junction of transistor 265. Likewise, a second voltage signal may be applied at $V_{in}$, such as a "high" signal, to effectively "reset" or re-establish the high states previously described. It will also now be appreciated that alternative embodiments of a bootstrap circuit in accordance with the invention may be employed to drive n-channel devices rather than p-channel devices, although the polarity of the voltage signals may need to be adjusted accordingly. Likewise, an NPN bipolar transistor should be employed in such an embodiment instead of the PNP bipolar transistor, illustrated in FIG. 2.

Figure 3:
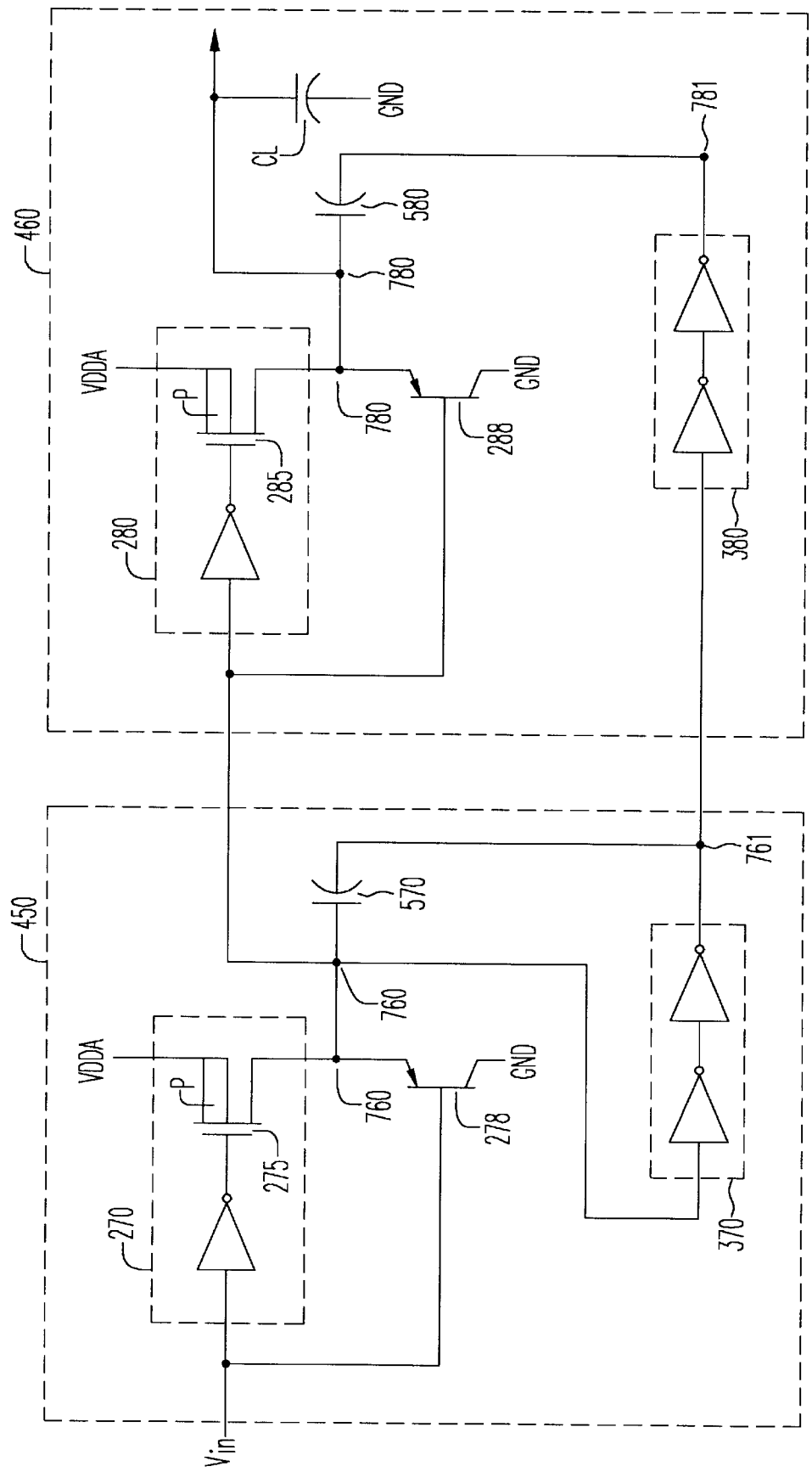
FIG. 3 is a schematic diagram illustrating an alternative embodiment of a bootstrap circuit in accordance with the invention.

FIG. 3 illustrates a schematic diagram of another embodiment of a bootstrap circuit in accordance with the invention. As illustrated in FIG. 3, this particular circuit is a two-stage bootstrap circuit, including stages 450 and 460, in comparison with the embodiment shown in FIG. 2. Of course, a bootstrap circuit in accordance with the invention is not limited in scope to any particular number of stages. In the embodiment shown in FIG. 3, capacitor 580 is on the order of 11 picofarads, whereas capacitor 570 is on the order of 4 picofarads. These capacitor values were selected to drive bootstrap node 780 approximately 2 volts below GND, although the scope of the invention is also not restricted in this respect. Likewise, the embodiment shown in FIG. 3 drives bootstrap node 760 approximately 0.8 volts below GND because the node is coupled to the base-collector junction of transistor 288. Driving node 760 to approximately −0.8 volts causes transistor 288 to saturate so that its collector-to-emitter voltage is less than 0.2 volts and capacitor 580 therefore charges to a voltage of approximately the supply voltage minus 0.2 volts. Likewise, after first stage 450 has charged capacitor 580, in second stage 460 driver 380 switches the bottom plate of capacitor 580 to GND and node 780 is driven to approximately 1.6 volts below GND, providing an additional or further voltage improvement. One problem that may result from having the base of transistor 288 at −0.8 volts while its emitter, coupled to node 780, is at −1.6 volts is conduction through transistor 288 in the reverse mode, i.e., the collector operating as the emitter and vice-versa. Where this occurs, node 780 will be discharged to GND. Therefore, in an embodiment of a bootstrap circuit in accordance with the invention, it may also be desirable to include a clamping circuit, such as a base clamping circuit, described hereinafter, to prevent transistor 288 from discharging capacitor 580 by such reverse mode operation.

Figure 4:
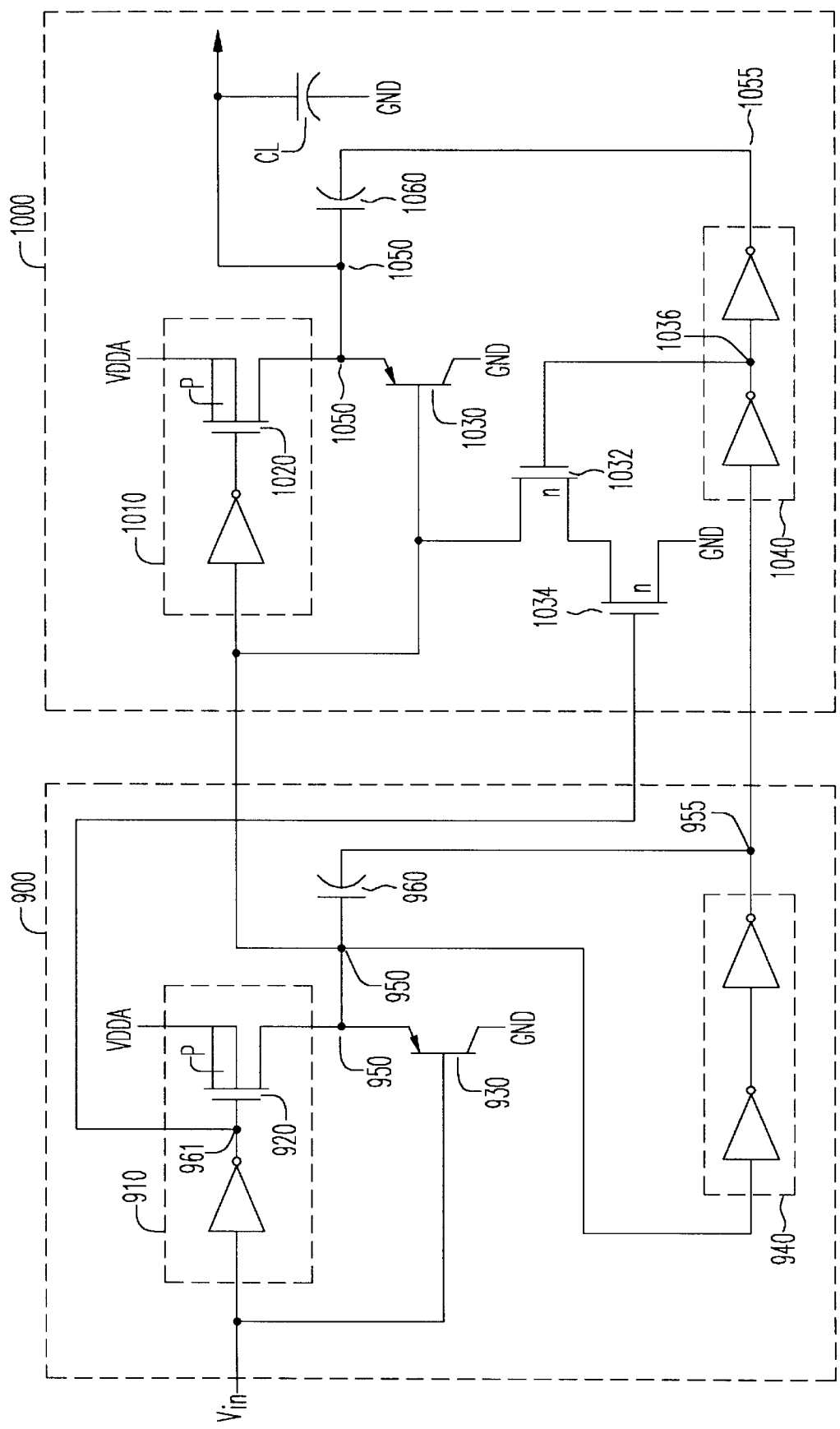
FIG. 4 is a schematic diagram illustrating yet another alternative embodiment of a bootstrap circuit in accordance with the invention.

FIG. 4 is a schematic diagram illustrating yet another alternative embodiment of a bootstrap circuit in accordance with the invention. As will be explained in more detail hereinafter, this particular embodiment includes a clamping circuit for the base of transistor 1030. As illustrated, FIG. 4 includes MOS devices 920, 1020, 1032, and 1034. Likewise, it includes bipolar transistors 930 and 1030 and capacitors 960 and 1060. As will be explained in more detail below, this particular embodiment operates like the embodiment illustrated in FIG. 3 with the addition that it includes a base clamping circuit, illustrated in this embodiment by devices 1032 and 1034, to prevent capacitor 1060 from discharging during operation of the bootstrap by inhibiting reverse mode operation of transistor 1030.

Much like the embodiment illustrated in FIG. 3, the first stage, designated 900 in FIG. 4, "bootstraps" node 950 to −0.8 volts when 995 switches to GND and bipolar transistor 1030 charges capacitor 1060 to the supply voltage minus the collector-emitter saturation voltage of transistor 1030, as previously explained with respect to FIG. 3. However, in this particular embodiment, node 1036 then transitions to a high state due to the time delay and, therefore, activates MOS device 1032, in this particular embodiment providing the base clamp for transistor 1030. The voltage applied to the gate of MOS device 1032 has the effect of "pulling" the voltage at the base of transistor 1030 to GND before bootstrap node 1050 is driven below GND. Therefore, in this particular embodiment, when node 1055 switches from VDDA to GND, node 1050 is driven to −1.8 volts. In comparison with FIG. 3, although transistor 1030 still exhibits reverse mode operation, the collector-base junction of the transistor is no longer forward-biased because the voltage across the base-collector junction is essentially zero, and, thus, bootstrap node 1050 is merely coupled to a reverse-biased p-n junction coupled to GND, instead of a transistor operating in reverse mode. Therefore, capacitor 1060 is substantially inhibited from discharging.

The clamping circuit comprising MOS device 1032 forms a regenerative loop involving nodes 950, 955, and 1036. Once this loop is activated, overpowering MOS device 1032 would be one way to effectively reset the bootstrap circuit once $V_{in}$ enters a "high" voltage state, such as 2.4 volts. However, to accomplish this would require a sufficiently large device 920 to overpower MOS device 1032. However, this may result in a relatively large current supply "glitch." To avoid this problem, in the embodiment illustrated, MOS device 1034 is provided to "break" the loop once $V_{in}$ is high. Thus, based on the embodiment illustrated in FIG. 4, the clamping circuit is now activated when $V_{in}$ is low, bootstrap node 950 in FIG. 4 has been driven below GND, and just prior to bootstrap node 1055 transitioning from high to low. The clamping circuit is disabled when $V_{in}$ becomes high.

Figure 5:
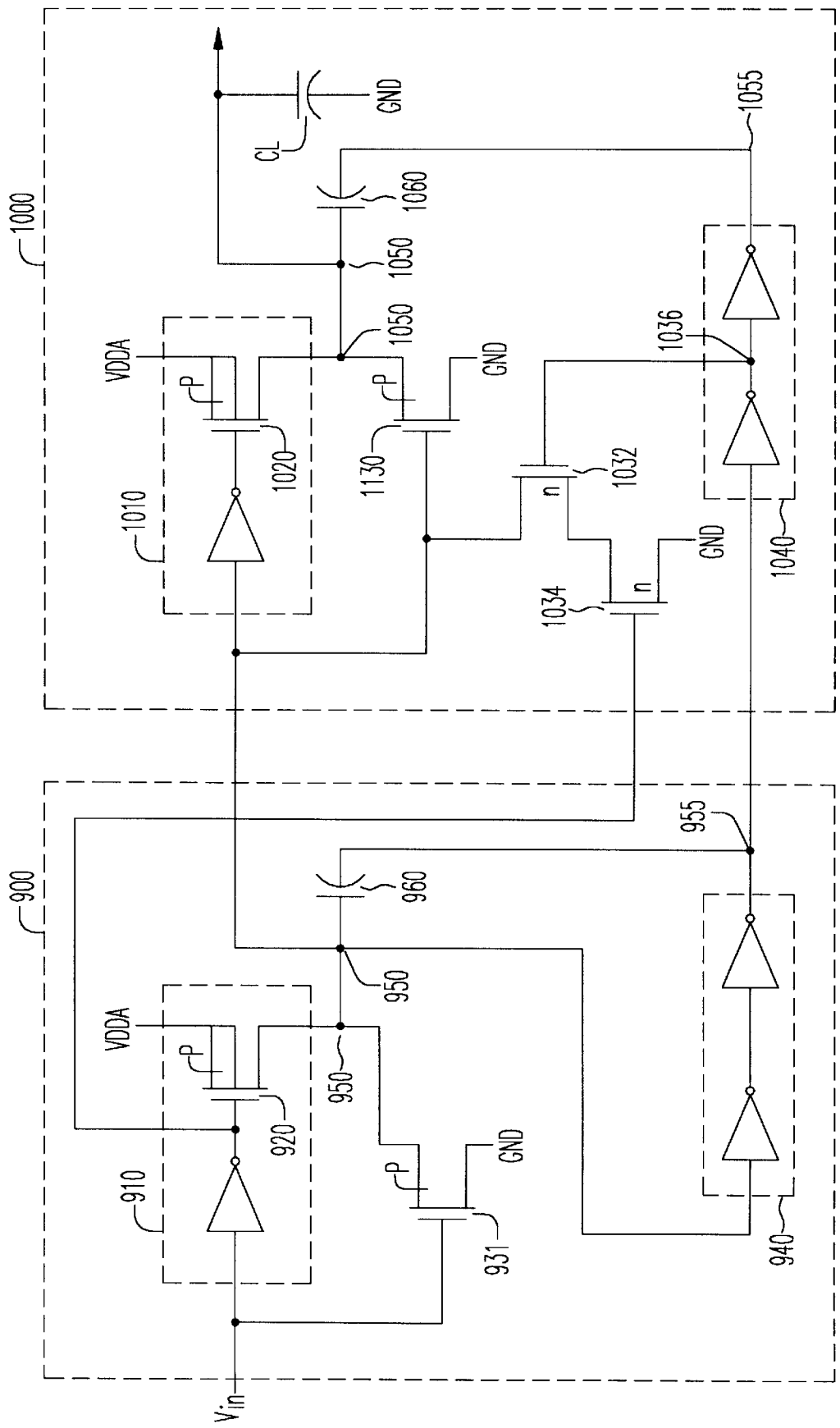
FIG. 5 is a schematic diagram illustrating still another alternative embodiment of a bootstrap circuit in accordance with the invention.

Likewise, it will now be appreciated that a bootstrap circuit in accordance with the invention including a clamping circuit is not restricted in scope to employing the circuit as a clamp for only a bipolar transistor. For example, as illustrated in FIG. 5, the clamping circuit in this particular embodiment is employed to inhibit reverse operation of MOS device 1130. As illustrated in FIG. 5, MOS device 1032 provides the clamp for the gate of device 1130 and operates in the manner previously described with respect to FIG. 4. As further illustrated in FIG. 5, the bipolar transistor in the first stage of FIG. 4 has been replaced with MOS device 931 in this particular embodiment. Of course, the advantage, previously described, regarding the use of a bipolar transistor having a base-emitter voltage on the order of 0.6 volts is not obtained by this particular embodiment.

While only certain features of the invention have been illustrated and described herein, many modifications, substitutions, changes or equivalents will now occur to those skilled in the art. It is, therefore, to be understood that the appended claims are intended to cover all such modifications and changes as fall within the true spirit of the invention.

I claim:

1. An integrated circuit comprising a bootstrap circuit including:

at least a pair of drivers and one capacitor coupled in a configuration forming a bootstrap node, each of said drivers having an input port; and a bipolar transistor having its emitter coupled to said node and having its base coupled to the input port of one of said drivers.

2. The integrated circuit of claim 1, and further comprising a base clamping circuit coupled to said bipolar transistor.

3. The integrated circuit of claim 2, wherein said base clamping circuit includes a MOS transistor coupling the base of said bipolar transistor to electrical ground.

4. A bootstrap circuit comprising:

at least two drivers having respective output ports coupled together via a capacitor to provide a bootstrap node on one side of said capacitor, each of said drivers also having an input port;

one of said drivers having its output port on the bootstrap node side of the capacitor including an output stage comprising a MOS transistor; and a bipolar transistor having its base coupled to the input port of said one of said drivers and its emitter coupled to the bootstrap node.

5. The bootstrap circuit of claim 4, and further comprising a base clamping circuit coupled to the base of said bipolar transistor.

6. The bootstrap circuit of claim 5, wherein said base clamping circuit includes a MOS device coupling the base of said bipolar transistor to electrical ground.

7. The bootstrap circuit of claim 4, wherein said at least two drivers, said capacitor, and said bipolar transistor form a first stage;

and further comprising a second stage coupled to said first stage;

said second stage including at least two drivers, a capacitor and a bipolar transistor coupled in a configuration forming a bootstrap circuit.

8. A bootstrap circuit comprising:

at least a pair of drivers and one capacitor coupled in a configuration forming a bootstrap node, each of said drivers also having an input port;

a transistor coupled to the bootstrap node; and a clamping circuit coupled to said transistor.

9. The bootstrap circuit of claim 8, wherein said transistor comprises a MOS transfer having a gate, a source and a drain;

said MOS transfer having its gate coupled to the input port of one of said drivers and having its source coupled to said node;

said clamping circuit comprising a gate clamping circuit.

10. A method of using a bipolar transistor in a bootstrap circuit comprising at least two drivers and at least one capacitor coupled in a configuration forming a bootstrap node, each of said drivers also having an input port;

the bipolar transistor having its emitter coupled to the bootstrap node and its base coupled to the input port of one of said drivers;

said method comprising the step of applying a first voltage signal to said input port of one of said drivers, said first voltage signal having a sufficient magnitude for activating the bipolar transistor.

11. The method of claim 10, and further comprising the step of applying a second voltage signal, said second voltage signal having a magnitude not sufficient for activating the bipolar transistor.

\* \* \* \* \*